United States Patent [19]

Schwalke

[11] Patent Number: 5,496,765
[45] Date of Patent: Mar. 5, 1996

[54] METHOD FOR MANUFACTURING AN INSULATING TRENCH IN A SUBSTRATE FOR SMART-POWER TECHNOLOGIES

[75] Inventor: Udo Schwalke, Heldenstein, Germany

[73] Assignee: Siemens Aktiengesellschaft, Munich, Germany

[21] Appl. No.: 479,819

[22] Filed: Jun. 7, 1995

Related U.S. Application Data

[63] Continuation of Ser. No. 264,142, Jun. 21, 1994, abandoned.

[30] Foreign Application Priority Data

Jun. 23, 1993 [DE] Germany ............................ 43 20 884.3

[51] Int. Cl.$^6$ .................................................. H01L 21/76
[52] U.S. Cl. ................................. 437/67; 437/62; 437/63; 437/160
[58] Field of Search .................................. 437/67, 62, 63, 437/64, 160, 61; 257/501, 510, 519

[56] References Cited

U.S. PATENT DOCUMENTS

| | | | |
|---|---|---|---|
| 4,471,525 | 9/1984 | Sasaki | 156/653 |
| 4,493,740 | 1/1985 | Komeda | 257/501 |
| 4,513,026 | 4/1985 | Miyamoto et al. | 437/240 |
| 4,666,556 | 5/1987 | Fulton et al. | 437/67 |
| 4,666,557 | 5/1987 | Collins et al. | 437/67 |
| 4,845,054 | 7/1989 | Mitchener | 437/240 |
| 4,872,947 | 10/1989 | Wang et al. | 156/653 |
| 5,008,210 | 4/1991 | Chiang et al. | 437/67 |
| 5,084,408 | 1/1992 | Baba et al. | 437/67 |
| 5,116,779 | 5/1992 | Iguchi | 437/61 |
| 5,202,279 | 4/1993 | Chung et al. | 437/47 |
| 5,314,845 | 5/1994 | Lee et al. | 437/225 |

FOREIGN PATENT DOCUMENTS

| | | | |
|---|---|---|---|
| 0259605 | 3/1988 | European Pat. Off. . | |
| 0296754 | 12/1988 | European Pat. Off. . | |
| 0328331 | 8/1990 | European Pat. Off. | 437/62 |
| 0016751 | 1/1990 | Japan | 437/62 |
| 2254731 | 10/1992 | United Kingdom . | |
| 85/04760 | 10/1985 | WIPO . | |
| 86/03620 | 6/1986 | WIPO . | |
| 86/04454 | 5/1992 | WIPO . | |

OTHER PUBLICATIONS

Becker, "Low Pressure Deposition of Doped $SiO_2$ by Pyrolysis of Tetraethylorthosilicate (TEDS)", J. Electrochem. Soc: Solid–State Science and Technology; vol. 134, No. 11; 1987; pp. 2923–2931.

Y. Ohata et al., "Dielectrically Isolated Intelligent Power Switch", IEEE 1987 Custom Integrated Circuits Conference, pp. 443–446.

N. Yasuhara et al., "SOI Device Structures Implementing 650 V High Voltage Output Devices on VLSIs", IEEE, IEDM 1991, pp. 141–144.

D. Widmann et al., "Technologie hochitegrierter Schaltungen", Springer–Verlag, pp. 80–83 & pp. 223–225.

Japanese Abstract, "Semiconductor Device and Manufacture Thereof", 61–90442, E–436, Sep. 12, 1986, vol. 10/No. 268, pp. 247–250.

Japanese Abstract, "Manufacture of Semiconductor Device", 62–76646, E–538 Sep. 8, 1987 vol. 11/No. 277, pp. 235–239.

Japanese Abstract, "Formation of Interelement Isolation Region of Semiconductor Device", 4–134844, E–1254 Aug. 26, 1992, vol. 16/No. 403, pp. 241–243.

(List continued on next page.)

*Primary Examiner*—Brian E. Hearn
*Assistant Examiner*—Trung Dang
*Attorney, Agent, or Firm*—Hill, Steadman & Simpson

[57] ABSTRACT

For manufacturing an insulation trench in a SOI substrate wherein logic components and high-voltage power components are integrated, a trench extending down onto the insulating layer of the SOI substrate is etched. By providing the sidewalls of the trench with an occupation layer containing a dopant and by drive-out from the occupation layer, diffusion regions neighboring the trench are produced. After complete removal of the occupation layer, a silicon layer is produced and an insulation structure is formed in the trench by thermal oxidation.

8 Claims, 5 Drawing Sheets

OTHER PUBLICATIONS

K. Fujino et al., "Surface Modification of Base Materials for TEOS/$O_3$ Atmospheric Pressure Chemical Vapor Deposition", 1046 Journal of the Electrochemical Society 139 (1992) Jun., No. 6, Manchester, NH, US, pp. 1690–1692.

A. Nakagawa et al., "500V Lateral Double Gate Bipolar-Mode MOSFET (DGIGBT) Dielectrically Isolated by Silicon Wafer Direct-Bonding (DISDB)", Extended Abstracts of the 20th (1988 international) Conference on Solid State Devices and Materials, Tokyo, 1988, pp. 33–36.

IBM Technical Disclosure Bulletin, "Sidewall Channel-Stop Doping For Deep-Trench Isolation of FET Devices", vol. 27, No. 10A, Mar. 1985, pp. 5501–5504.

METHOD FOR MANUFACTURING AN INSULATING TRENCH IN A SUBSTRATE FOR SMART-POWER TECHNOLOGIES

This is a continuation of application Ser. No. 08/264,142, filed Jun. 21, 1994, now abandoned.

BACKGROUND OF THE INVENTION

1. Field of the Invention

The present invention is directed generally to smart-power technologies and more specifically to a method for manufacturing an insulating trench in a substrate for smart-power technologies.

2. Description of the Related Art

Smart-power technology is known as the monolithic integration of complex logic components with high-voltage power components in one substrate. Since the logic components are operated with voltage levels of about 5 volts, but voltages up to 500 volts occur at the high-voltage power components, an electrical separation of the high-voltage components from the logic components is required.

It is known to completely electrically insulate the high-voltage and low-voltage components from one another by dielectric insulation (see, for example, Yu Ohata et al, IEEE 1987 CICC, Pages 443–446). The components are thereby realized in a SOI substrate. A SOI substrate has an insulating layer of $SiO_2$ on a single-crystal silicon wafer and a single-crystal silicon layer on the insulating layer. This single-crystal silicon layer is the surface of the SOI substrate. The insulating layer of the SOI substrate assures the vertical insulation, whereas the lateral insulation of the components is realized by trenches filled with insulating material. For many applications, the voltage behavior of the components is improved in that the sidewalls of the trenches are $n^+$ or $p^+$ doped over the entire depth down to the insulating layer of the SOI material before the trenches are filled with oxide (see N. Yasuhara et al, IEDM 1991, Pages 141–144).

For producing the lateral insulation, it is known to first implement the doping of the sidewalls after the etching of the trench. For example, this doping ensues by drive-out from doped glasses such as boron silicate glass (BSG) or phosphorous silicate glass (PSG), by occupation from the vapor phase or by ion implantation. The trench is subsequently filled with $SiO_2$. For example, this occurs by thermal oxidation or by chemical vapor deposition (CVD) deposition of $SiO_2$.

Since trench depths of about 20 μm having aspect ratios (i.e., the quotient of trench depth to trench width) of 5–10 occur in smart-power technologies, it is problematical to produce a diffusion region having a uniform, prescribable expanse by ion implantation in the doping of the sidewalls. The ion implantation must be implemented angled, whereby the substrate must be turned four times in order to assure a somewhat uniform dopant concentration at all walls. Since doses of at least $5 \times 10^{15}$ atoms/cm$^2$ are necessary, this method is extremely time-consuming.

In the doping by drive-out from glasses or by occupation from the vapor phase, the layer of doped glass or the occupation layer must be in turn removed after the formation of the diffusion region in order to avoid an uncontrolled drive-out from these layers or a contamination of the equipment during the course of the further process execution. The layers used as doping sources must thereby be removed residue-free. Since these layers are $SiO_2$-like and are arranged directly on the insulating layer of the SOI substrate at the bottom of the trench, no etching stop is present at the bottom of the trench. During the residue-free removal of these layers, an attack on the insulating layer of the SOI substrate therefore occurs. When the trench is subsequently filled with $SiO_2$ by thermal oxidation, the fact that the insulating layer has been incipiently etched or etched through leads to the formation of cavities that can no longer be filled. When the trench is filled using CVD $SiO_2$, either an inadequate conformity of the deposition at atmospheric pressure or an extremely low deposition rate given low-pressure deposition must be accepted.

SUMMARY OF THE INVENTION

The invention provides a method for producing an insulating trench in a SOI substrate wherein logic components and high-voltage power components are integrated. The method produces diffusion regions having a defined expanse in the sidewalls of the trench. Also, the method provides that the trench can be filled void-free even when the insulating layer of the SOI substrate is etched through.

The object is inventively resolved by a method for manufacturing an insulation trench in a SOI substrate having integrated logic components and high-voltage power components, having the steps of providing an SOI substrate with a monocrystalline silicon wafer, an insulating layer of $SiO_2$ oriented thereon and a monocrystalline silicon layer oriented on the insulating layer, etching a trench into the monocrystalline silicon layer, the trench extending down to the insulating layer, providing sidewalls of the trench with an occupation layer containing a dopant, producing diffusion regions in the monocrystalline silicon layer neighboring the trench by drive-out from the occupation layer, removing the occupation layer completely, producing a silicon layer having essentially conformal edge coverage, and producing an insulation structure in the trench by a thermal oxidation.

In the method of the invention, diffusion regions neighboring the trench are formed in the monocrystalline silicon layer by drive-out from an occupation layer containing the dopant that is applied onto the sidewalls of the trench. After the drive-out, the occupation layer is completely removed. Subsequently, a silicon layer is applied. An insulating structure is produced in the trench by thermal oxidation. Since a volume expansion by a factor of approximately two results in the oxidation of silicon, a thickness of the silicon layer need not amount to more than at most one fourth of the width of the trench. In particular, the silicon layer is amorphously deposited in a LPCVD method. The silicon layer can also be produced polycrystalline. Amorphous silicon, however, has a finer structure than polycrystalline silicon and therefore leads to a better conformity in the edge coverage.

In the manufacturing method of the invention, it is not critical when the insulating layer of the SOI substrate is completely etched through, as can be required for a residue-free removal of doped glasses, because the insulation oxide that has been etched off is largely replaced by oxidation of the silicon layer. Doped glasses such as, for example, BPSG deposited under atmospheric pressure can therefore be used for the occupation layer in the method of the invention. These doped glasses are used in a standard way for planarization in CMOS fabrication. These doped glasses are suitable as diffusion sources in the form of BSG or PSG. Given aspect ratios of a type that occur given insulating trenches in smart-power technologies, these APCVD glasses exhibit poor conformity. An etch-through of the insulating layer of the SOI substrate therefore occurs given the complete removal of the occupation layer when these glasses are used as occupation layer.

It lies within the framework of the invention to produce a $SiO_2$ layer and/or $Si_3N_4$ layer having essentially conformal edge coverage after the removal of the occupation layer. The silicon layer is applied onto the surface of this $SiO_2$ layer and/or $Si_3N_4$ layer. Subsequently, the silicon layer is selectively etched relative to $SiO_2$ or, respectively, $Si_3N_4$ in an anisotropic etching process, whereby horizontal surfaces of the $SiO_2$ or, respectively, $Si_3N_4$ layer are uncovered. Silicon spacers therefore result at vertical edges of the monocrystalline silicon layer of the SOI substrate. In the thermal oxidation, these silicon spacers are oxidized and swell due to volume expansion. At the same time, that part of the $SiO_2$ layer that is arranged at the bottom of the trench is reinforced.

In the oxidation of the silicon spacers, an insulation structure results wherein a clearance remains between opposite sidewalls. It lies within the framework of the invention to fill this clearance with a silicon fill by deposition and re-etching of a further silicon layer.

Alternatively, the clearance can be filled with $SiO_2$ that is deposited in a CVD method using a process gas containing at least $O_3$ and $Si(OC_2H_5)_4$. Using a process gas containing $O_3$ and $Si(OC_2H_5)_4$ in a CVD process, narrow trenches having a high aspect ratio can be filled void-free.

The invention shall be set forth in greater detail below with reference to an exemplary embodiment and to the figures.

DETAILED DESCRIPTION OF THE PREFERRED EMBODIMENTS

Figure 1:
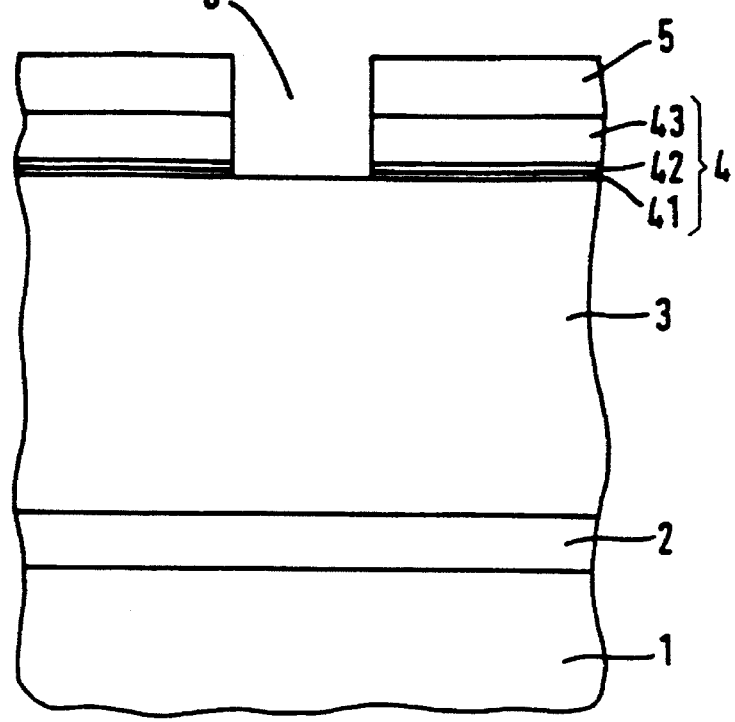
FIG. 1 illustrates an SOI substrate having a trench mask of the present invention.

An SOI substrate has a monocrystalline substrate 1, an insulating layer 2 and a monocrystalline silicon layer 3 (see FIG. 1). The monocrystalline silicon substrate 1, for example is $p^+$-doped with a dopant concentration of, for example, $5 \times 10^{19}$ boron/$cm^3$. The insulating layer 2 is $SiO_2$ and has a thickness of, for example, 2 μm. The monocrystalline silicon layer 3, for example, is lightly n-doped with a dopant concentration of, for example, $4 \times 10^{14}$ phosphorous/$cm^3$ and a thickness of, for example, 20 μm. The SOI substrate is preferably manufactured according to the direct wafer bonding (DWB) or silicon direct bonding (SDB) method that is known, for example, from Yu Ohata et al, IEEE 1987 CICC, Pages 443–446.

A trench mask 4 is formed on the surface of the monocyrstalline silicon layer 3. To that end, the surface of the monocrystalline silicon layer 3 is first thermally oxidized. A lower layer 41 of thermal $SiO_2$ having a thickness of, for example 50 nm results. A middle layer 42 of a CVD $Si_3N_4$ having a thickness of, for example, 150 nm is produced thereon. An upper layer 43 of a CVD $SiO_2$ is deposited on the middle layer 42 with a thickness of, for example, 1000–1600 nm. The layer sequence consisting of the lower layer 41, the middle layer 42 and the upper layer 43 is structured using a photoresist mask 5, for example in a $CHF_3/O_2$ dry-etching process.

Figure 2:
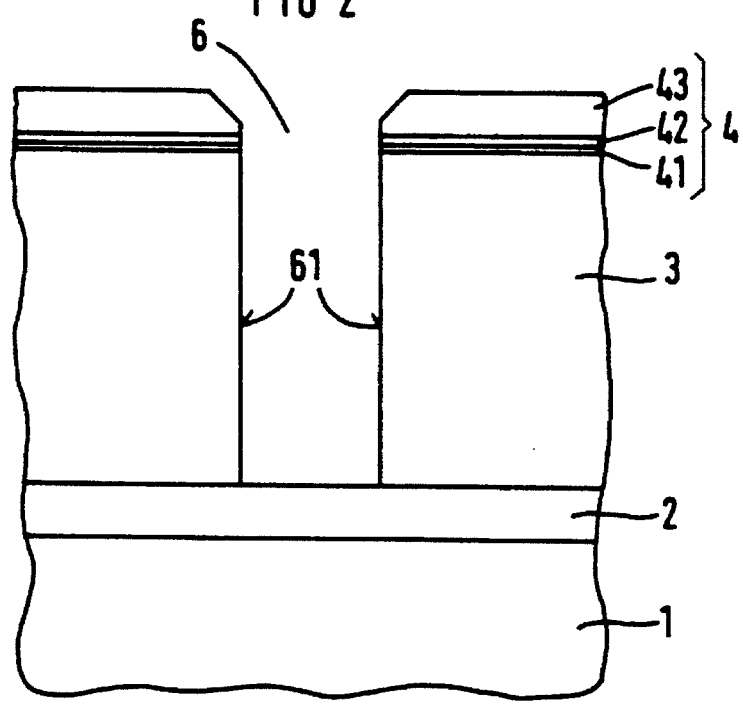
FIG. 2 illustrates the SOI substrate after the trench etching of the present invention.

After the removal of the photoresist mask 5, a trench 6 is etched into the monocrystalline silicon layer 3 (see FIG. 2). For example, the etching of the trench 6 occurs in an anisotropic dry-etching process with a $Cl_2/O_2$ chemistry. After the removal of etching products in a HF dip, the trench 6 is present with clean sidewalls 61 on the SOI substrate.

Figure 3:
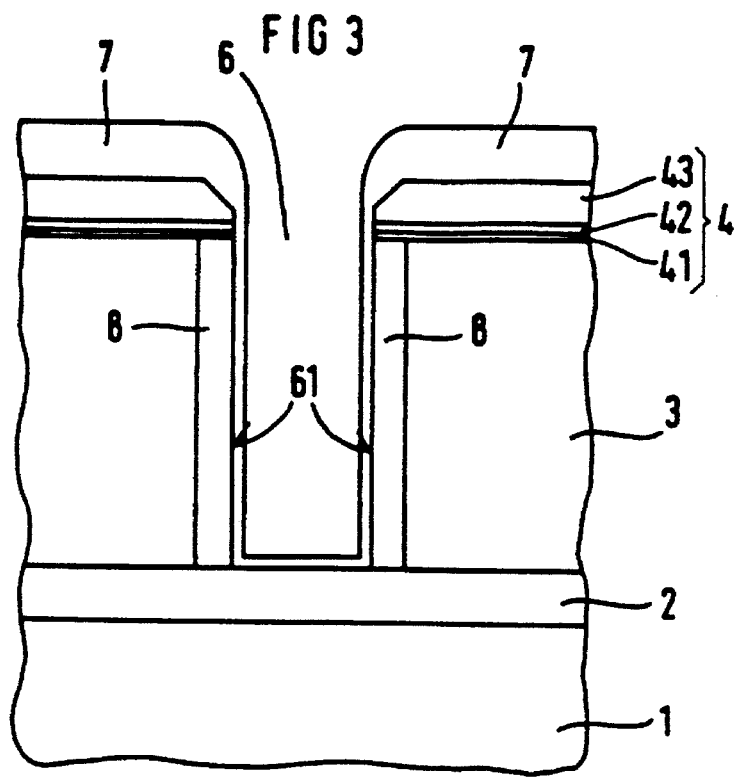
FIG. 3 illustrates the SOI substrate after deposition of an occupation layer and formation of diffusion regions neighboring the trench of the present invention.

An occupation layer 7 of doped glass is applied onto the surface of the monocrystalline silicon layer 3 with the trench 6 in a CVD method at atmospheric pressure (APCVD). For example, the occupation layer 7 is BSG having four weight percent boron. The occupation layer 7 is deposited with a thickness of, for example, 800–1600 nm, preferably 1600 nm, above the trench mask 4. Due to the deficient conformity of the deposition, the thickness of the occupation layer at the sidewalls 61 and at the bottom of the trench 6 then is 100–200 nm (see FIG. 3). The part of the occupation layer 7 arranged at the sidewalls 61 of the trench 6 serves as diffusion source.

In a temperature step at, for example, 1000° C. over, for example, thirty minutes, dopant is driven from the occupation layer 7 through the sidewalls 61 of the trench 6 into the monocrystalline layer 3. A diffusion region 8 neighboring the trench 6 results. In the temperature step, the occupation layer 7 flows, so that an over-hang in the region of the trench mask 4 that arose after the deposition disappears and vertical sidewalls of the occupation layer 7 are formed in the region of the trench 6.

Figure 4:
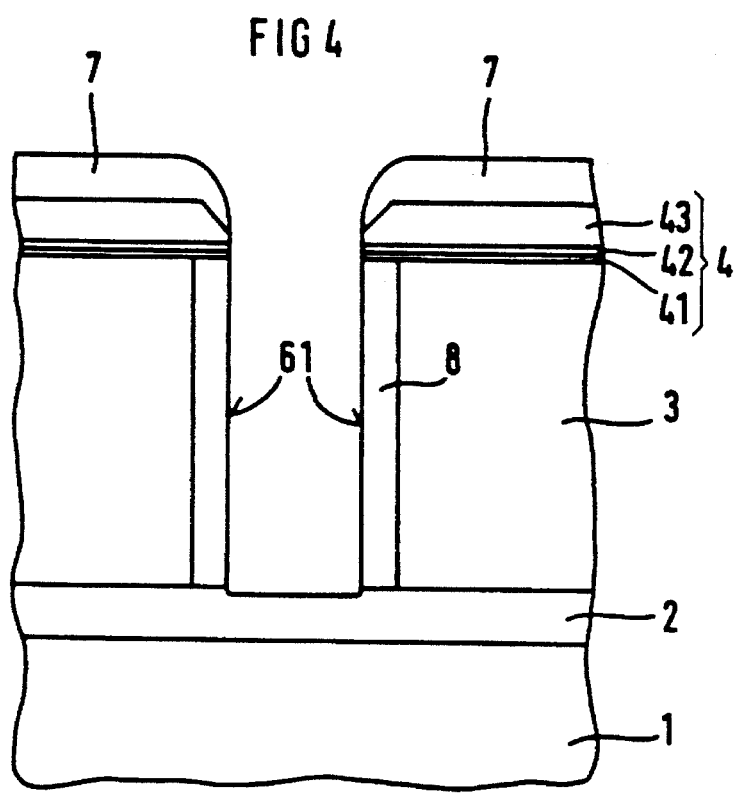
FIG. 4 illustrates the SOI substrate after the removal of the occupation layer at the sidewalls and at the floor of the trench of the present invention.

In an isotropic, wet-chemical etching with, for example, hydrofluoric acid in a HF dip, that part of the occupation layer 7 arranged on the sidewalls 61 and on the bottom of the trench 6 is removed (see FIG. 4). In this etching step, the surface of the insulating layer 2 of the SOI substrate is attacked. A lateral under-etching of the insulating layer 2 under the monocrystalline layer 3 of a few nanometers occurs. The isotropic wet-chemical etching must be implemented until that part of the occupation layer 7 arranged at the sidewalls 61 and the bottom of the trench 6 is removed.

Figure 5:
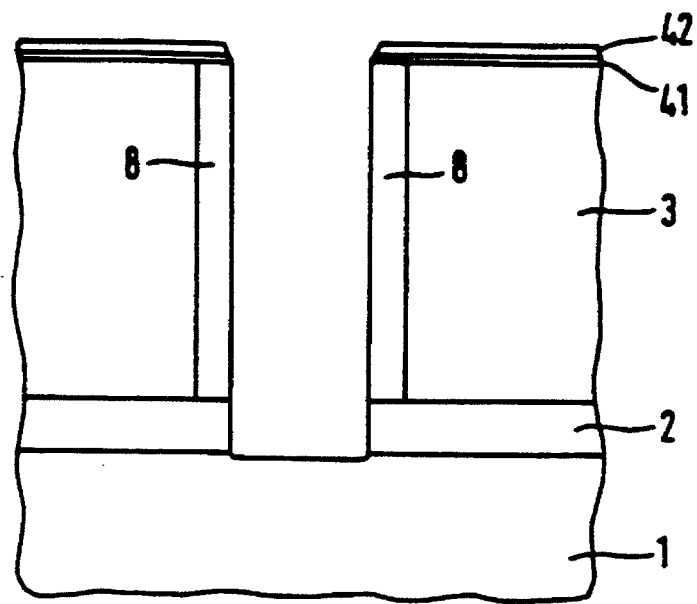
FIG. 5 illustrates the SOI substrate after complete removal of the occupation layer of the present invention.

That part of the occupation layer 7 arranged at the surface of the trench mask 4 is removed with an anisotropic dry etching. The anisotropic dry etching occurs, for example, with $CHF_3/O_2$. In the anisotropic dry-etching, the insulating layer 2 of the SOI substrate and the upper layer 43 of the trench mask 4 are simultaneously etched off (see FIG. 5). The anisotropic dry-etching is implemented selectively relative to silicon. As a result thereof, an incipient etching of the surface of the monocrystalline silicon substrate 1 of the SOI substrate is largely avoided.

Figure 6:
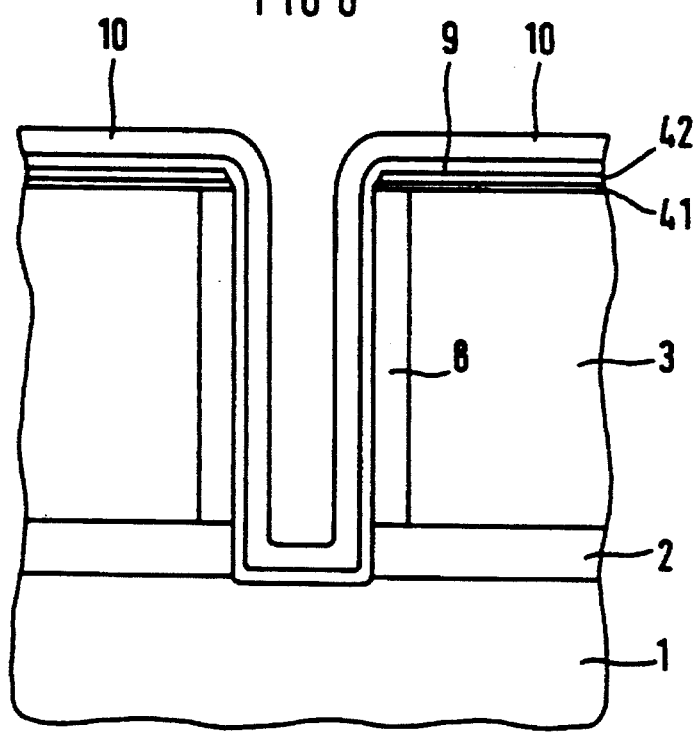
FIG. 6 illustrates the SOI substrate after deposition of a $SiO_2$ layer and of a silicon layer of the present invention.

Subsequently, for example, a $SiO_2$ layer 9 is applied having a thickness of, for example, 200 nm. The $SiO_2$ layer 9 is applied with conformal edge coverage. For example, it is formed in a LPCVD method by decomposition of $Si(OC_2H_5)_4$ (TEOS). A silicon layer 10 is deposited onto the $SiO_2$ layer 9. The silicon layer is produced with essentially conformal edge coverage and a thickness of, for example, 400 nm in a LPCVD method (See FIG. 6). The silicon layer 10 is deposited amorphously undoped. The layer thicknesses of the $SiO_2$ layer 9 and of the silicon layer 10 are matched to the trench width. They must be optimized for the given trench geometry. The trench width in this exemplary embodiment amounts, for example, to 2 μm.

Figure 7:
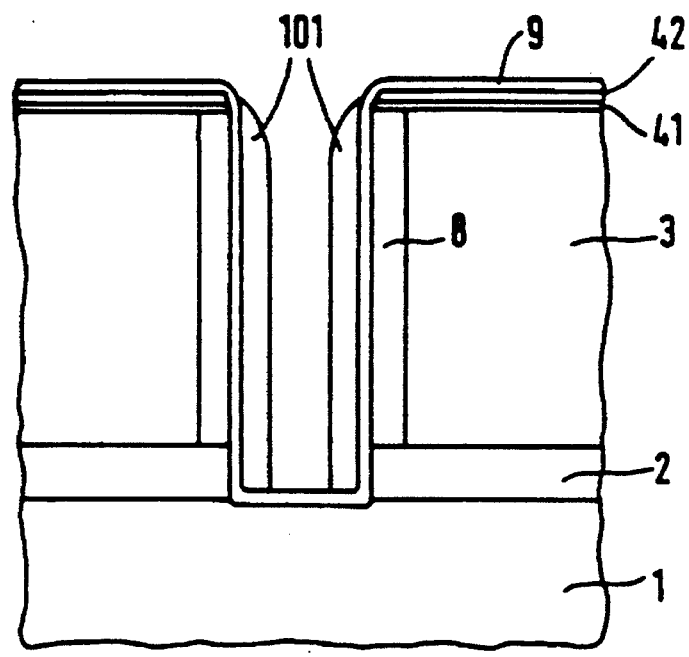
FIG. 7 illustrates the SOI substrate after the formation of silicon spacers of the present invention.

In an anisotropic etching process selectively relative to $SiO_2$, the silicon layer 10 is subsequently etched until horizontal surfaces of the $SiO_2$ layer 9 are uncovered. Silicon spacers 101 thereby form at the sidewalls of the trench 6 (See FIG. 7). For example, the anisotropic etching occurs in a $HBr/Cl_2$ chemistry.

A thermal oxidation is subsequently implemented. For example, this occurs at 1000° C. in a humid atmosphere. The silicon spacers 101 are thereby oxidized to form $SiO_2$ and form an insulation structure 11. A volume increase occurs during the oxidation (see FIG. 8). At the same time, the $SiO_2$ layer 9 is reinforced in the region of the bottom of the trench 6. A bird's beak 12 is formed by oxidation in the region of the edge of the lower layer 41 of the trench mask 4.

In applications wherein the reinforcement of the $SiO_2$ layer 9 in the region of the bottom of the trench and the fashioning of the bird's beak 12 at the upper edge of the trench should be avoided, a $Si_3N_4$ layer or a double layer of $SiO_2$ and $Si_3N_4$ can be used at the surface instead of the $SiO_2$ layer 9.

Figure 9:
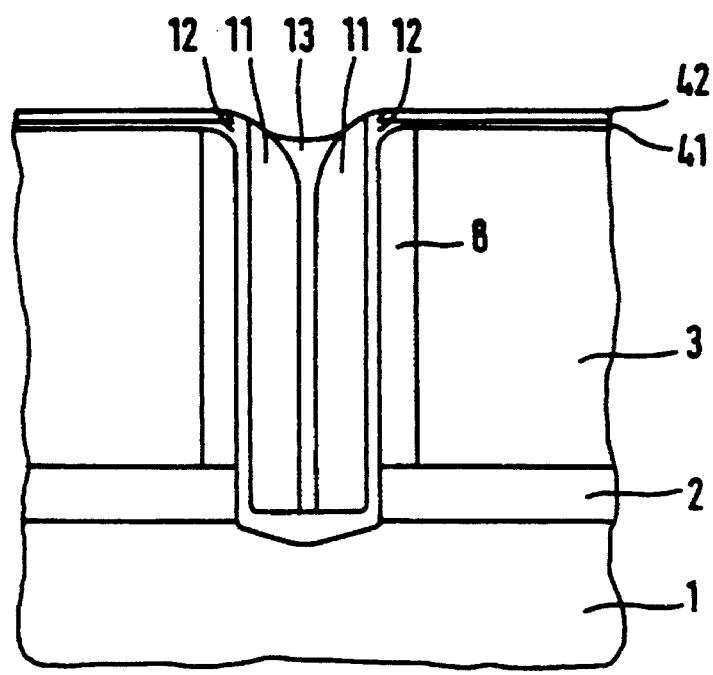
FIG. 9 illustrates the SOI substrate after the clearance between the insulating structure has been filled with a silicon fill of the present invention.

A clearance remaining between opposite edges of the insulating structure 11 is filled with a silicon fill 13 by deposition of a further silicon layer and re-etching of the silicon layer (see FIG. 9). The re-etching of the further silicon layer is designed such that the silicon fill 13 terminates in height approximately with the lower layer 41 of the trench mask 4. In an etching that is selective relative to $Si_3N_4$, uncovered parts of the $SiO_2$ layer 9 are subsequently removed. The etching is continued until the surface of the middle layer 42 of the trench mask 4 is uncovered (see FIG. 9).

Figure 10:
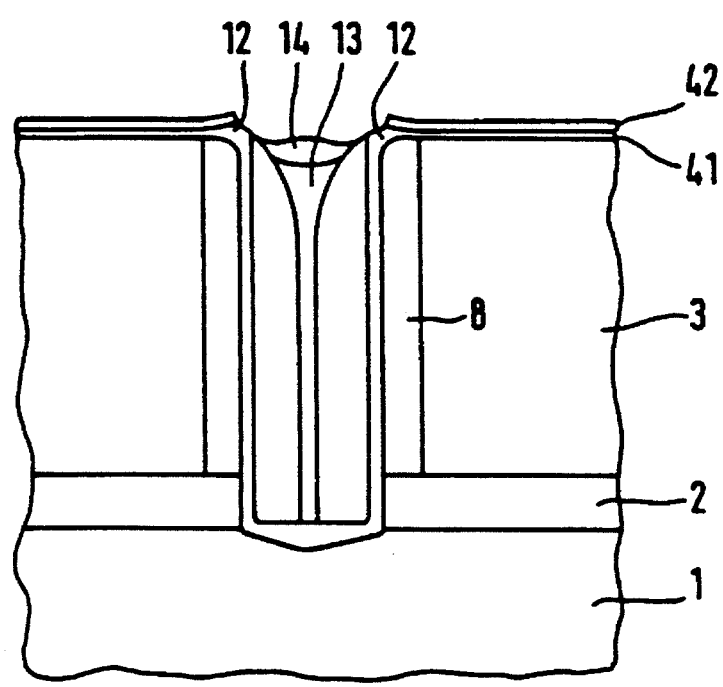
FIG. 10 illustrates the SOI substrate after the oxidation of the silicon fill of the present invention.

In a thermal oxidation at, for example, 1000° C. in a humid atmosphere, the surface of the silicon fill 13 is oxidized. An insulation termination 14 that completely covers the silicon fill 13 is thereby formed (see FIG. 10). At the same time, the bird's beak 12 enlarges. The bird's beak 12 contributes to increasing the breakdown voltage by rounding the edges.

Subsequently, the components are produced in the monocrystalline silicon layer 3 within the framework of planar processes.

Figure 8:
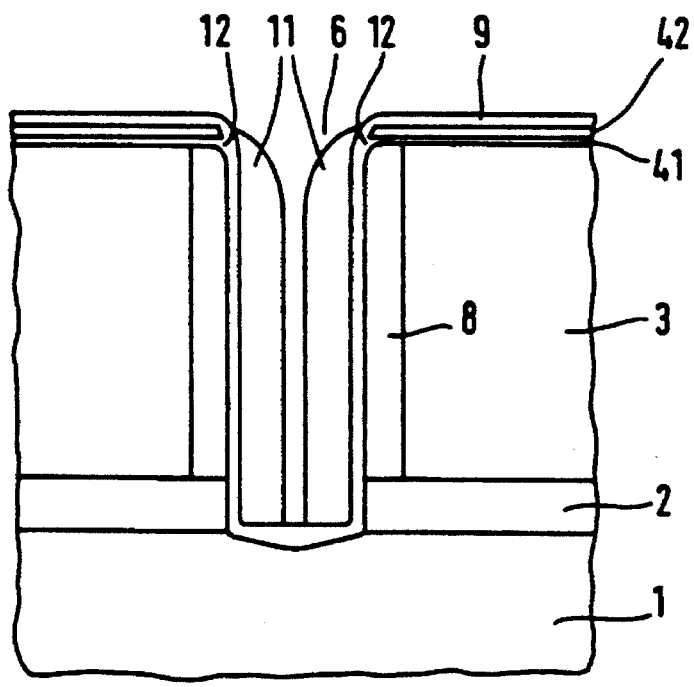
FIG. 8 illustrates the SOI substrate after the thermal oxidation of the silicon spacers of the present invention.

The clearance shown in FIG. 8 between opposite edges of the insulation structure 11 can be alternatively filled by conformal deposition of $SiO_2$, preferably in a CVD method using $O_3$ and $Si(OC_2H_5)_4$ as initial process gas.

Only conventional methods for trench doping and trench filling from CMOS fabrication are used in the method of the invention. Since the CMOS fabrication is already necessary for producing the logic components, a synergy effect is thereby exploited.

Since the method of the invention is insensitive to incipient etching and through-etching of the insulating layer of the SOI substrate, a larger process window is possible.

Improved electrical properties are achieved by the self-aligned insulation termination at the surface of the trench given simultaneous edge rounding and bird's beak.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. Method for manufacturing an insulation trench in an SOI substrate having integrated logic components and high-voltage power components, said method comprising the steps of:

providing an SOI substrate having a monocrystalline silicon wafer, an insulating layer of $SiO_2$ oriented thereon and a monocrystalline silicon layer oriented on said insulating layer;

etching a trench into said monocrystalline silicon layer, said trench extending down to said insulating layer;

providing sidewalls of said trench with an occupation layer containing a dopant wherein said occupation layer is produced with doped glass in a CVD method at atmospheric pressure (APCVD);

producing diffusion regions in said monocrystalline silicon layer neighboring said trench by drive-out of dopant from said occupation layer onto said monocrystalline silicon layer wherein said drive-out, occurs during a temperature step causing said occupation layer to flow;

removing said occupation layer completely;

producing a silicon layer having essentially conformal edge coverage of said trench by amorphously depositing said silicon layer; and producing an insulation structure in said trench by thermal oxidation.

2. Method according to claim 1, wherein said step of producing an insulation structure in said trench by thermal oxidation is further defined by conducting said thermal oxidation in a humid atmosphere having a temperature range between 900° C. and 1200° C.

3. Method according to claim 2, wherein said step of providing said sidewalls of said trench with an occupation layer is further defined by producing said occupation layer with doped glass in a CVD method at atmospheric pressure (APCVD).

4. Method according to claim 1, further comprising the steps of:

producing an insulating layer with essentially conformal edge coverage after removing said occupation layer, said insulating layer containing at least one of the compounds selected from the group consisting of $SiO_2$ and $Si_3N_4$ said silicon layer being applied onto said insulating layer, selectively etching said silicon layer relative to said insulating layer in an anisotropic etching process to uncover horizontal surfaces of said insulating layer to form silicon spacers in said trench at vertical edges of said monocrystalline silicon layer, said silicon spacers having a clearance therebetween; and wherein said step of producing an insulation structure in said trench by thermal oxidation is further defined by thermally oxidizing said silicon spacers in said trench.

5. Method according to claim 4, further comprising the step of filling the clearance in said trench with a silicon fill by deposition and re-etching of a further silicon layer.

6. Method according to claim 5, further comprising the steps of:

etching said trench using a trench mask, said trench mask having a layer sequence with a lower layer of thermal $SiO_2$, a middle layer of CVD $Si_3N_4$ and an upper layer of CVD $SiO_2$;

removing said upper layer of said trench mask upon removal of said occupation layer;

conducting said re-etching of said further silicon layer such that said silicon fill terminates under said lower layer of said trench mask; and oxidizing said surface of said silicon fill to completely cover said silicon fill with an insulation termination.

7. Method according to claim 6, wherein said step of oxidizing said surface of said silicon fill to completely cover said silicon fill with an insulation termination is further defined by oxidizing said surface of said silicon fill in a humid atmosphere having a temperature range between 900° C. and 1200° C.

8. Method according to claim 4, further comprising the step of:

filling the clearance within said insulation structure in said trench with a $SiO_2$ fill in a CVD method using a process gas containing at least $O_3$ and $Si(OC_2H_5)_4$.

* * * * *